United States Patent [19]

Lamson et al.

[11] Patent Number: 5,083,187
[45] Date of Patent: Jan. 21, 1992

[54] INTEGRATED CIRCUIT DEVICE HAVING BUMPED POWER SUPPLY BUSES OVER ACTIVE SURFACE AREAS AND METHOD OF MANUFACTURE THEREOF

[75] Inventors: Michael A. Lamson, Van Alstyne; Darvin R. Edwards, Dallas, both of Tex.

[73] Assignee: Texas Instruments Incorporated, Dallas, Tex.

[21] Appl. No.: 686,866

[22] Filed: Apr. 16, 1991

Related U.S. Application Data

[63] Continuation of Ser. No. 523,959, May 16, 1990, abandoned.

[51] Int. Cl.⁵ .............................. H01L 23/48
[52] U.S. Cl. ............................ 357/71; 357/68
[58] Field of Search ....................... 357/68, 71

[56] References Cited

U.S. PATENT DOCUMENTS

| | | | |
|---|---|---|---|
| 4,742,023 | 5/1988 | Hasagawa | 357/71 |
| 4,835,593 | 5/1989 | Arnold et al. | 357/71 |

OTHER PUBLICATIONS

W. Schroen, "Chip Packages Enter the 21st Century", Machine Design, Feb. 11, 1988, pp. 137-143.
G. Heinen, et al., "Multichip Assembly with Flipped Integrated Circuits", IEEE Transactions on Components, Hybrids, and Manufacturing Technology, vol. 12, No. 4, Dec. 1989, pp. 650-657.

*Primary Examiner*—Eugene R. LaRoche
*Assistant Examiner*—R. Ratliff
*Attorney, Agent, or Firm*—Robby T. Holland; N. Rhys Merrett; Melvin Sharp

[57] ABSTRACT

An integrated circuit device is disclosed. In one embodiment, the device has a semiconductor chip having an electrical circuit that is connected to a bonding pad. A metal layer overlies the bonding pad, and a metal bump is connected to the metal layer. The metal bump receives power for the electrical circuit. The method of manufacture allows a designer to form a power supply bus in the metal layer. The metal layer may lie over an active circuit of the semiconductor chip.

7 Claims, 3 Drawing Sheets 5,083,187

INTEGRATED CIRCUIT DEVICE HAVING BUMPED POWER SUPPLY BUSES OVER ACTIVE SURFACE AREAS AND METHOD OF MANUFACTURE THEREOF

This application is a continuation of application Ser. No. 06/523,959, filed May 16, 1990, now abandoned. Pat. No. 5,083,188

FIELD OF THE INVENTION

This invention is in the field of integrated circuits, and is more specifically directed to on chip power supply buses.

BACKGROUND

A problem VLSI circuit designers face is how to minimize noise in the on chip power supply buses. Many factors contribute to noise in the power supply buses. One such factor, for example, is the switching of high speed output buffer circuitry. As the speed of transition is increased by increasing the drive capability of the output buffer circuits, the parasitic inductance associated with the connection of the output buffer circuits to the power supply buses increases, thereby generating noise. Other contributing factors include chip size and refresh current. Larger chip sizes for increased memory capacity devices have longer on chip power supply buses and therefore have more inductance. In dynamic random access memory devices, DRAM's (as in 16 megabit DRAM's having $2^{24}$ memory cells), higher currents for refresh cycles result in higher voltage drops in the Vss and Vdd buses.

Designers try to minimize noise in the on chip power supply buses in a variety of ways. Improved output buffer circuits switching at different times minimizes "dirty" voltage. Output buffer circuits near power supply bonding pads along the edge of the silicon die reduces the length of current travel. Short wire bonds connecting the power supply bonding pads to lead fingers of the lead frame further reduce inductance.

In 16MB DRAM design, new techniques are required to further minimize noise in the on chip power supply buses.

It it an object, therefore, of this invention is to provide an integrated circuit device whose power supply buses are constructed to minimize noise.

Other objects and advantages of this invention will be apparent to those of ordinary skill in the art having references to the following specification, together with the drawings.

SUMMARY OF THE INVENTION

An integrated circuit device is disclosed. In one embodiment, the device has a semiconductor chip having an electrical circuit that is connected to a bonding pad. A metal layer overlies the bonding pad, and a metal bump is connected to the metal layer. The metal bump receives power for the electrical circuit. The method of manufacture allows a designer to form a power supply bus in the metal layer. The metal layer may lie over an active circuit of the semiconductor chip.

DETAILED DESCRIPTION OF THE PREFERRED EMBODIMENT

Figure 1:
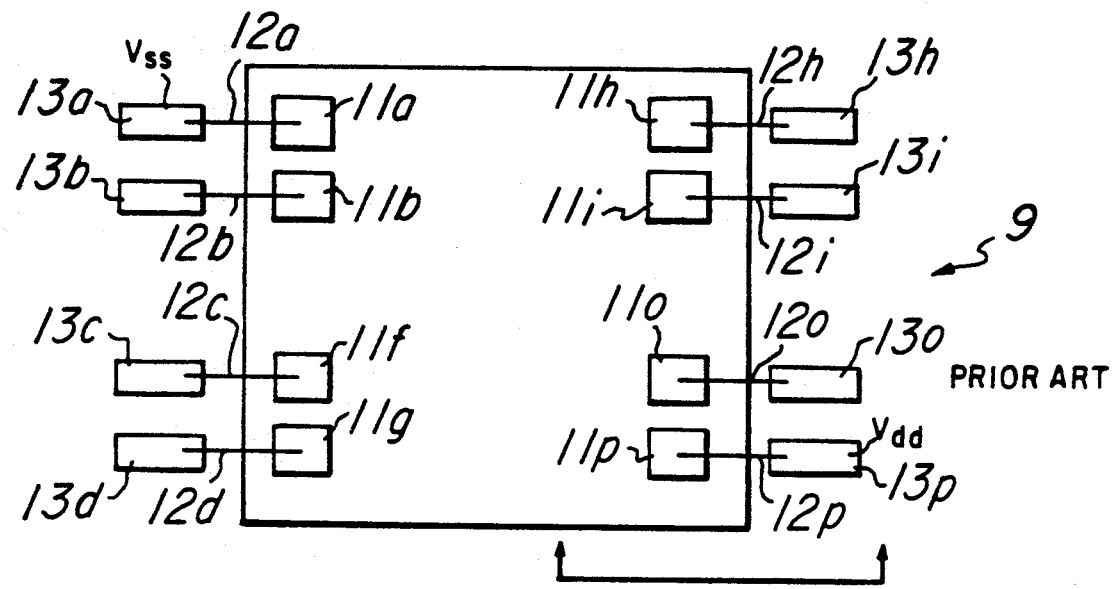
FIG. 1 is a top view drawing illustrating a prior art integrated circuit device.

FIG. 1 is a top view drawing illustrating a prior art integrated circuit device, it being well known to VLSI designers how to construct an I/C device having a semiconductor chip attached by wire bonds to a lead frame. Integrated circuit device 9 can be any MOS device, such as a gate array, or a DRAM, formed on semiconductor chip 10. The active devices, not shown, of semiconductor chip 10 are connected to respective bonding pads 11a–11p for external connection. In a DIP package, there are usually 16 such bonding pads 11 that are typically formed of aluminum. The bonding pads 11 usually lie along the edges of semiconductor chip 10. Wire bonds 12 connect lead fingers 13 to bonding pads 11. Wire bonds 12 are typically gold. A substance such as plastic typically encapsulates chip 10, wire bonds 12, and parts of lead fingers 13. I/C device 9 is typically mounted to a printed circuit board.

Figure 2:
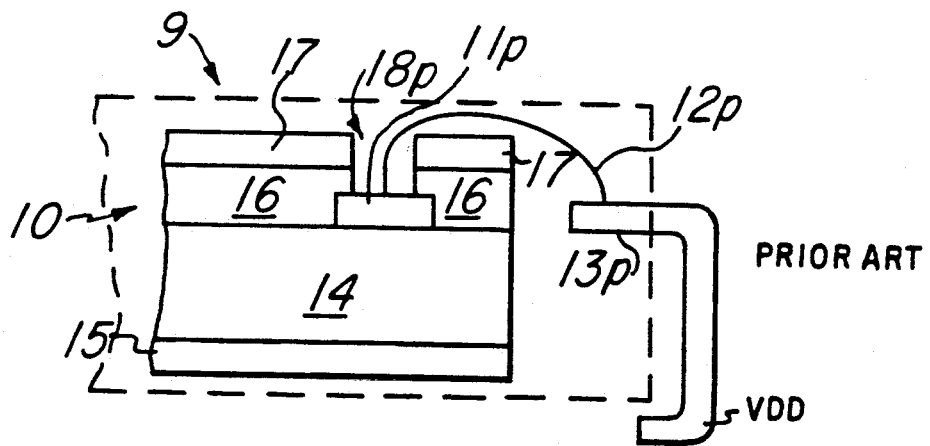
FIG. 2 is a partial side view drawing of the end of I/C device 9 of FIG. 1 by bonding pad 11p.

FIG. 2 is a partial side view drawing of the end of I/C device 9 by bonding pad 11p. Semiconductor Chip 10 is formed of silicon layer 14, passivation oxide layer 16, and pix 17. The active circuits lie in silicon layer 14 as is well known in the art. Aluminum bonding pad 11p is illustrated lying on top of silicon layer 14. In construction, passivation oxide layer 16 is applied on top of silicon layer 14 and bonding pads 11. Pix 17 is applied over passivation oxide layer 16. The device is etched so that a via 18 is formed through pix 17 and passivation oxidation layer 16 to the surface of bonding pads 11. Semiconductor chip 10 is usually attached to a die attach 15 for connection to a lead frame. Wire bond 12p has one end connected to lead finger 13p. The other end of wire bond 12p passes through via 18p and is connected to the surface of bonding pad 11p. The dotted line in FIG. 2 illustrates the encapsulation material.

Integrated circuit device 9 of FIGS. 1 and 2 receives externally provided power. The external power is received by connecting a lead finger to a power supply. Power is transferred from the power supply, through the lead finger, through the wire bond, through the bonding pad, and is distributed throughout the chip. Ground voltage Vss, and positive voltage Vdd, usually of +5.0 volts, are supplied through separate lead fingers. In FIG. 1, for example, Vss may be connected to lead finger 13a and Vdd may be connected to lead finger 13p.

Figure 3:
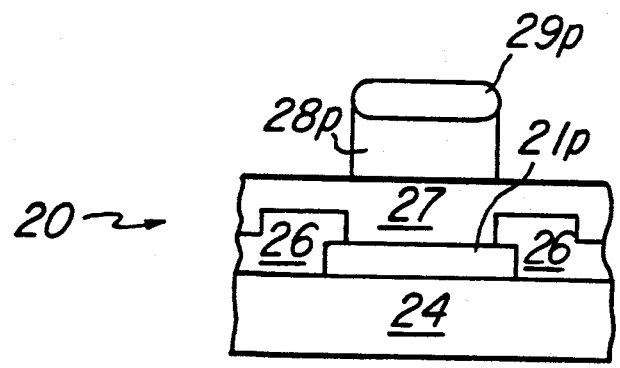
FIG. 3 is a side view drawing illustrating the preferred embodiment of the invention.

FIG. 3 is a side view drawing illustrating the preferred embodiment of the invention. An end of semiconductor chip 20, similar to the end of integrated device 9 of FIG. 2, is illustrated. Silicon layer 24 has bonding pad 21p and passivation oxidation layer 26 attached to it in the usual fashion. Overlying passivation layer 26 and bonding pad 21 is interconnection metallization layer 27. (Passivation oxidation layer 26 is etched so that interconnection metallization layer 27 is attached and forms electrical connection to bonding pad 21p). Attached to interconnection metallization layer 27 over bonding pad 21p is metal bump 28p. Metal bump 28p has solder cap 29p attached to its head.

Figure 7:
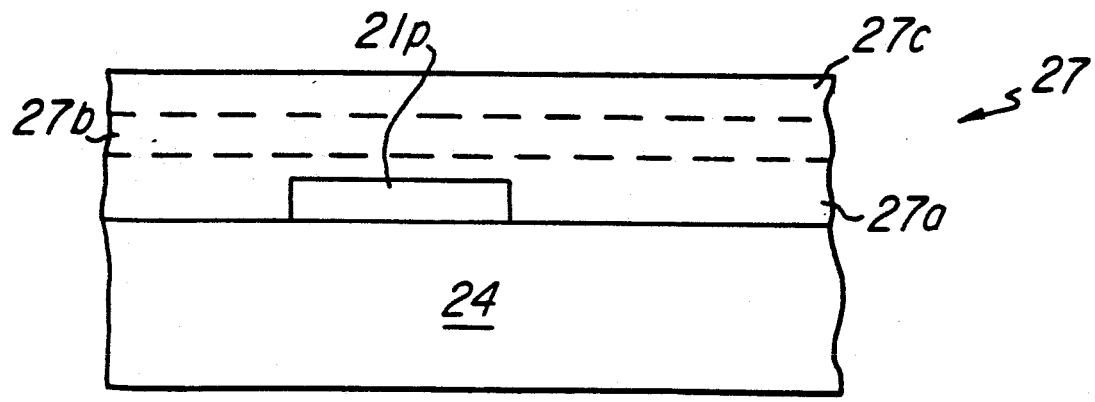
FIG. 7 is a side view drawing illustrating the triple level barrier metal scheme of the interconnection metallization layer illustrated in FIG. 3.

Interconnection metallization layer 27 is an additional layer of metal placed over the passivation layer 26 of the semiconductor chip to perform interconnection between the bond pad locations for power distribution in the preferred embodiment. In the preferred embodiment, it is formed of a three level metal system, illustrated in FIG. 7, that is resistant to moisture induced corrosion. Interconnection metallization layer 27 may first have a chrome or titanium layer 27a connecting the passivation layer 26 and bond pad 21p to act as an adhesion layer. Next might be a thick layer of nickel or copper 27b for minimum conductor resistance and good step coverage. On top is a corrosion resistant metal such as gold or palladium for the surface 27c. Interconnection metallization layer 27 may be referred to as a "barrier metal" level because it acts as a diffusion barrier.

A number of barrier metal combinations are suitable for covering aluminum bond pad 21p and the other unshown exposed metal areas of chip 20. Properties of concern are adhesion to the chip passivation layer 26 and and aluminum bond pad 21, stress, process latitude and selectivity, thickness, and cost. Some metals that provide adhesion are chromium, titanium, and titanium tungsten (TI:W). Some metals that act as barriers to the aluminum, i.e., prevent aluminum migration, and are inexpensive enough to apply thickly for good step coverage across the chip are nickel and copper. Gold is a good choice for the surface level because it minimizes corrosion and other reactions.

In the preferred embodiment, interconnection metallization layer 27 consists of 1-kA Cr, 5-kA Cu, and 5kA Au, based upon performance in accelerated moisture testing and ease of processing. These metals may be deposited by sputtering in a single vacuum pump down in order to avoid contamination and oxidation of the interfaces. Photo patterning with conventional negative photo resist and proximity printing is adequate. Chemical etching of the gold and copper is done with an amonium iodide/iodine mixture in the chromium by caustic ferricyanide. The patterned multi layer metal overlap of the passivation is one the order of about 13 microns (0.5 mil.) on either side of bond pad 21p. This acts to seal aluminum bond pad 21p against attack by the etches.

Still referring to FIG. 3, metal bump 28p, connected to interconnection metallization layer 27, provides the means for attaching chip 20 to external power. The attached arrangement and device is known in the art as a "flipped-chip" interconnection. Such a flipped-chip interconnection device is described in the article entitled "Multichip Assembly with Flipped Integrated Circuits" written by the inventors, and others, appearing in IEEE Transactions on Components, Hybrids, and Manufacturing Technology Volume 12, No. 4, December 1989.

Metal bump 28p may be of any number of compositions including copper with a solder cap 29p, as illustrated in the preferred embodiment of FIG. 3, or may be solder alone. The solder cap 29p allows for reflow bonding. Bump 28p may be formed by copper plating. A thin film of copper is sputtered between +05-kA to 10-kA over integrated circuit 20. Vias for bump plating may be provided by a dry film photoresist that is typically available in 25 to 50 microns thickness. In obtaining the desired bump height of 85 to 100 microns, it is preferable to laminate two resist layers together, as is well known in the art. The solder cap 29p attached to bump 28p is plated immediately following the copper plating. The solder plating composition is a 10/90 tin/-lead fluoborate bath because it is readily controllable and allows for higher reflow temperatures than other solder plating compositions such as the 60/40 tin/lead solder. The solder is allowed to mushroom over the resist to 13 microns.

The overall process for forming interconnection metallization layer 27 and metal bump 28 with solder cap 29 can be described as follows: apply barrier deposition; apply barrier metal resist deposition and pattern; etch barrier metal; apply copper flash; apply thick resist lamination and pattern; apply copper bump plating; apply solder cap plating; strip thick resist; etch copper flash; and, clean up.

Figure 4:
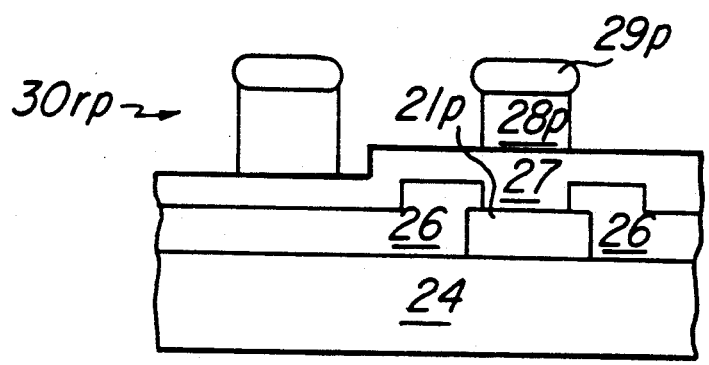
FIG. 4 is a side view drawing illustrating an alternative embodiment of the invention.

Applying an interconnection metallization layer that connects to a bonding pad advantageously allows redundant metal bumps to be formed, thus allowing more than one electrical interconnection to to a bonding pad. FIG. 4 is a side view drawing of semiconductor chip 20 of FIG. 3 showing an additional redundant bump 30 rp. Redundant bump 30 rp is connected to interconnection metallization layer 27. Redundant bump 30 rp may advantageously lie over an active circuit area of integrated circuit device 20. Passivation oxidation layer 26 protects the active circuits of integrated circuit 20 from any electrical signal passing through redundant bump 30 rp. The ability to place redundant bumps over active circuit areas is a significant advantage and will be discussed later herein.

With respect to metal bumps 30 rp and 30p of FIG. 4, spacing between the bumps is a concern in that patterning accuracy suffers when the bump to bump space is less than the thickness of the resist used. It is desirable that the diameter of the bump be the same or greater than the height of the bump and the bump to bump space be the same or greater than the bump diameter. Therefore, in the preferred embodiment of FIG. 4, metal bumps 28p and 30rp are about 100 microns in diameter, about 85 microns tall, with about 100 microns separating them.

Figure 5:
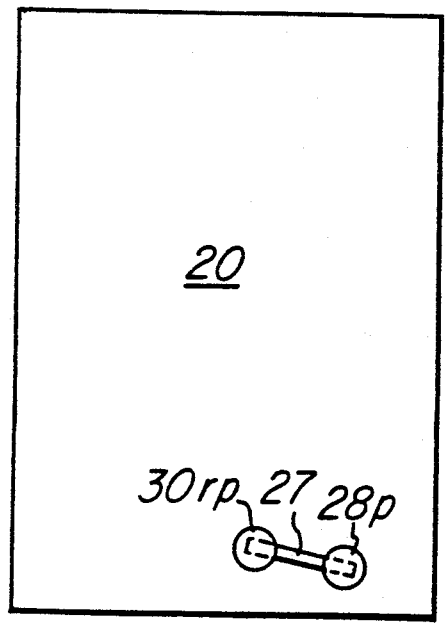
FIG. 5 is a top view drawing of the device of FIG. 4.

FIG. 5 is a top view drawing of the redundant bump integrated circuit device of FIG. 4. Redundant bump 30 rp is closer to the center of chip 20 than bump 30 p and rp can result in a bump over an active circuit area. It is connected to bump 28p by interconnection metal layer 27.

External power can advantageously be supplied to the active circuits of integrated circuit device 20 of FIGS. 4 and 5 through both bumps 28p and 30rp by virtue of interconnection metallization layer 27. This significant advantage makes it possible to design semiconductor chips around circuit constraints rather than bond pad constraints. It is possible to place buffer circuits where they make the most sense from a circuit design standpoint rather than where they are required for periphery bond purposes. On-chip power supply buses are easily designed by patterning interconnect metallization layer 27 and by patterning the metal bumps. This results in on-chip power supply buses that can be wider, thicker, and made of lower resistant metals than normal. The contacts to the points of current distribution can be multiple along the length of the power supply bus and be in direct contact. Wire bonds are advantageously eliminated. The thicker and wider power supply bus has lower resistance, lower inductance, and minimization of voltage drops, all of which decrease noise and increase device performance.

Figure 6:
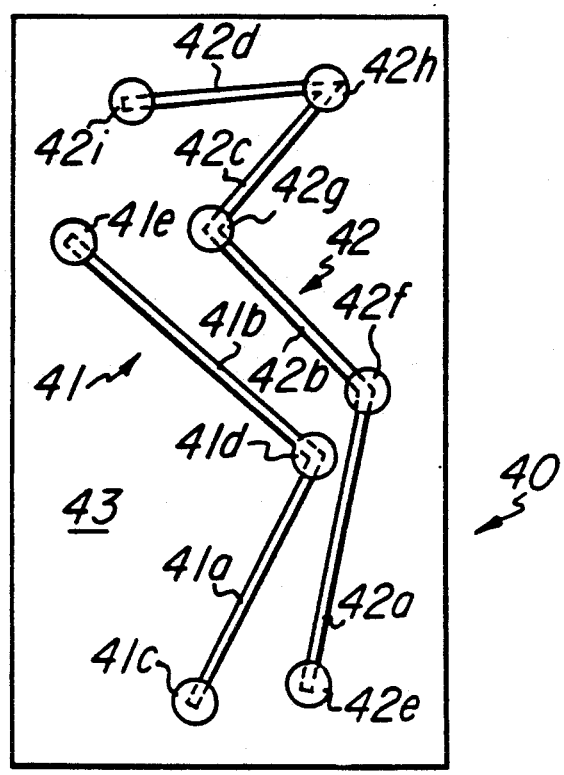
FIG. 6 is a top view drawing illustrating patterning and placement of an interconnection metallization layer and metal bumps.

FIG. 6 is a top view drawing of an integrated circuit device 40 illustrating patterning and placement of the interconnection metallization layer and bumps. Any patterning and placement suitable to a designer may of course be used. Power supply buses 41 and 42 respectively supply Vss and Vdd to the electrical devices of semiconductor chip 43. Power supply bus 41 is patterned into the interconnection metallization layer of device 40 and consists of connected segments 41a and 41b. Attached to segments 41a and 41b are metal bumps 41c, 41d, and 41e. As stated earlier herein, the passivation oxidation layer of device 40 separates segments 41a and 41b from any underlying circuits of chip 43 with etches through the passivation oxidation layer allowing for electrical contact between the power supply buses and the circuits. Vdd power supply bus 42 is comprised of interconnection metallization segments 42a, 42b, 42c and 42d. Metal bumps 42e, 42f, 42g, 43h and 42i are attached to the metallization segments 42. Because of patterning, segments 41 do not touch segments 42 and no shorting occurs.

From a designer's standpoint, the bumped power supply buses of integrated circuit device 40 illustrated in FIG. 6 may be formed as follows. Through electrical modeling, determine where power supply buses are required for optimal noise performance. Place bumps in the desired locations. Design the interconnection metallization layer to interconnect bumps to bonding pads and power supply buses to bonding pads. Pattern the interconnection metal. Pattern the photo resist for bumps. Thus, in an application such as in the design of DRAMs, designers may place output buffers where it is most convenient from a design standpoint, supply external power to that point through a bump, interconnection metal, and bonding pad, as opposed to placing the output buffers near to bonding pads along the edge of the chip.

The invention yields several other advantages. Metal bumps may be placed on any existing integrated circuit having bonding pads without requiring redesign of the circuit in question. Stress in the chip can be minimized by placing bumps close to the center of the chip. Stress on the metal bumps can be minimized by placing a larger number of the bumps on chip. Bus interconnections can be minimized since it is realized that buses can now run from one end of the chip to the other, by virtue of the interconnection metallization layer, without the use of additional silicon real estate. By virtue of redundant bumps, device assembly yield is increased through reduced continuity failure. The processing required in applying the interconnection metallization level to the passivation oxidation layer of the I/C acts as a screen against any chips with passivation oxidation damage. Defective chips can be screened internally, thereby improving reliability of the product to the customer.

Although the invention has been described in detail herein with reference to its preferred embodiment, it is to be understood that this description is by way of example only, and is not to be construed in a limiting sense. It is to be further construed that numerous changes in the details of the embodiments of the invention, in additional embodiments of the invention, will be apparent to and may be made by persons of ordinary skill in the art having reference to this description. It is contemplated that such changes in additional embodiments are within the spirit and true scope of the invention as claimed below.

What is claimed is:

1. An integrated circuit device comprising:
   a semiconductor chip having an active circuit formed in a face thereof;
   a terminal in electrical contact with the active circuit for transferring power thereto;
   a passivation oxidation layer overlying the terminal, having a via so that electrical connection can be made to the terminal through the via;
   a patterned metal layer overlying the oxidation layer and the active circuit, and filling the via for transferring power to the terminal; and
   a plurality of metal bumps connected to the patterned metal layer, for receiving power.

2. The device of claim 1 wherein the second level of metal comprises:
   an adhesion layer of metal;
   a barrier level of metal overlying the adhesion level of metal; and
   a non-reactive level of metal overlying the barrier level of metal.

3. A power bus for a semiconductor chip having an active face with terminals thereon and an insulating layer covering the active face with apperatures in it exposing the terminals, comprising:
   a metal strip overlying the insulating layer, connected through the apperatures to various of the terminals of the semiconductor chip to transfer power to the various terminals; and
   a plurality of metal bumps adhered to the metal layer strip for receiving electrical power.

4. The power bus of claim 3 wherein the metal strip, comprises:
   an adhesion layer of metal adjacent to the various terminals;
   a conductor layer of metal on top of the adhesion layer; and
   a corrosion resistant layer of metal on top of the conductor layer.

5. The power bus of claim 4 wherein the adhesion layer of metal is chrome, the conductor layer of metal is copper, and the corrosion resistant layer of metal is gold.

6. A packaged semiconductor device, comprising:
   a semiconductor die having an active face with terminals thereon disposed within an encapsulant;
   a dielectric layer over the active face of the semiconductor die, having vias in it over the terminals;
   a power supply bus over the dielectric layer in electrical contact to different ones of the terminals through their vias having a plurality of metal bumps adhered to it that extend through the encapsulant for receiving electrical power.

7. The packaged semiconductor device of claim 6 wherein the power supply bus comprises a strip of patterned layers of metal.

* * * * *